United States Patent
Wu et al.

(10) Patent No.: US 8,344,257 B2
(45) Date of Patent: Jan. 1, 2013

(54) FLEXIBLE PRINTED CIRCUIT AND FABRICATION METHOD THEREOF

(75) Inventors: Chung-Lun Wu, Taoyuan County (TW); Fu-An Chu, Taoyuan County (TW); Ja-Ee Li, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 551 days.

(21) Appl. No.: 12/568,471

(22) Filed: Sep. 28, 2009

(65) Prior Publication Data

US 2010/0314164 A1   Dec. 16, 2010

(30) Foreign Application Priority Data

Jun. 10, 2009   (TW) ................. 98119340 A

(51) Int. Cl.
*H05K 9/00* (2006.01)
*H05K 1/00* (2006.01)
*H05K 3/00* (2006.01)

(52) U.S. Cl. ........ 174/250; 174/251; 174/257; 174/260; 174/261; 361/749; 361/750; 361/751; 361/816; 29/825; 29/829

(58) Field of Classification Search .......... 174/250–269, 174/117 R, 117 F, 110 R, 113 R, 117 FF, 174/377, 378, 386; 361/748–751, 760–76, 361/782–794, 777, 816, 818, 820; 333/4, 333/5, 238, 260, 1; 29/825–852
See application file for complete search history.

(56) References Cited

U.S. PATENT DOCUMENTS

| | | | | |
|---|---|---|---|---|
| 4,418,239 A | * | 11/1983 | Larson et al. | 174/34 |
| 4,776,087 A | * | 10/1988 | Cronin et al. | 29/828 |
| 4,798,918 A | * | 1/1989 | Kabadi et al. | 174/36 |
| 5,293,001 A | * | 3/1994 | Gebs | 174/36 |
| 5,418,504 A | * | 5/1995 | Nottenburg | 333/1 |
| 5,449,863 A | * | 9/1995 | Nakatani et al. | 174/250 |
| 5,981,043 A | * | 11/1999 | Murakami et al. | 428/209 |
| 6,281,451 B1 | * | 8/2001 | Chan et al. | 174/262 |
| 6,333,468 B1 | * | 12/2001 | Endoh et al. | 174/256 |
| 6,353,189 B1 | * | 3/2002 | Shimada et al. | 174/255 |
| 6,696,133 B2 | * | 2/2004 | Ueno et al. | 428/138 |
| 6,777,622 B2 | * | 8/2004 | Ueno et al. | 174/262 |
| 7,276,986 B2 | * | 10/2007 | Barr et al. | 333/1 |
| 7,399,929 B2 | * | 7/2008 | Ueno et al. | 174/117 FF |
| 7,518,884 B2 | * | 4/2009 | Wright | 361/794 |
| 7,645,941 B2 | * | 1/2010 | Wesselman et al. | 174/251 |
| 7,672,142 B2 | * | 3/2010 | Wang et al. | 361/789 |
| 7,709,750 B2 | * | 5/2010 | Hashimoto et al. | 174/378 |
| 7,842,886 B2 | * | 11/2010 | Kobayashi et al. | 174/117 R |
| 7,868,254 B2 | * | 1/2011 | Matsushita et al. | 174/117 FF |

(Continued)

FOREIGN PATENT DOCUMENTS

JP   404313300 A   * 11/1992

(Continued)

*Primary Examiner* — Michail V Datskovskiy
(74) *Attorney, Agent, or Firm* — Birch, Stewart, Kolasch & Birch, LLP

(57) ABSTRACT

A flexible printed circuit and fabrication method thereof is provided. At least one signal wire is disposed on a plastic substrate. Two ground lines are disposed at both sides of the signal wire in parallel. A shielding layer is provided, contacting the plastic substrate to form a chamber, wherein the signal wire and ground lines are wrapped therein. A flexible dielectric layer is implemented between the signal wire and the shielding layer to provide electricity isolation.

18 Claims, 3 Drawing Sheets

U.S. PATENT DOCUMENTS

| | | | |
|---|---|---|---|
| 8,044,746 B2 * | 10/2011 | Blair et al. | 333/5 |
| 2002/0157865 A1 * | 10/2002 | Noda | 174/261 |
| 2003/0112617 A1 * | 6/2003 | Ueno et al. | 361/826 |
| 2008/0202807 A1 | 8/2008 | Wesselman et al. | |
| 2008/0296048 A1 * | 12/2008 | Muro et al. | 174/254 |
| 2009/0000804 A1 * | 1/2009 | Kobayashi et al. | 174/117 F |
| 2009/0173533 A1 | 7/2009 | Brock et al. | |
| 2009/0242253 A1 * | 10/2009 | Muro et al. | 174/260 |
| 2009/0244859 A1 * | 10/2009 | Muro et al. | 361/749 |
| 2009/0294155 A1 * | 12/2009 | Suzuki et al. | 174/254 |

FOREIGN PATENT DOCUMENTS

| | | | |
|---|---|---|---|
| JP | 7-106767 A | | 4/1995 |
| JP | 7-283579 A | | 10/1995 |
| JP | 02002033556 A | * | 1/2002 |
| JP | 02002237221 A | * | 8/2002 |
| KR | 2005001697 | * | 1/2005 |
| WO | WO 2005/091688 A1 | | 9/2005 |
| WO | WO 2006/121194 A1 | | 11/2006 |
| WO | WO 2007133405 A2 | | 11/2007 |

* cited by examiner

FLEXIBLE PRINTED CIRCUIT AND FABRICATION METHOD THEREOF

CROSS REFERENCE TO RELATED APPLICATIONS

This Application claims priority of Taiwan Patent Application No. 98119340, filed on Jun. 10, 2009, the entirety of which is incorporated by reference herein.

BACKGROUND OF THE INVENTION

1. Field of the Invention

The invention relates to flexible printed circuits (FPC), and in particular, to an enhanced structure of the FPC that is resistant to interferences.

2. Description of the Related Art

Flexible printed circuits (FPCs) are widely used in portable electronic devices such as mobile phones. However, for conventional FPCs, as a transmission signal frequency increases, interference, such as coupling effects, occurs between signal wires, thereby causing the quality of transmission to degrade. Therefore, an enhanced FPC structure that controls impedance without changing the basic structure of the FPC is desirable.

BRIEF SUMMARY OF THE INVENTION

An embodiment of a flexible printed circuit is provided, comprising a plastic substrate. At least one signal wire is disposed on the plastic substrate for transmitting signals. At least two ground lines are arranged at both sides of the signal wire in parallel. A shielding layer engages the plastic substrate to form a chamber that wraps the signal wire and ground lines therein. A flexible dielectric material covers the signal wire, and insulates the signal wire from the shielding layer.

An embodiment of a fabrication method for fabricating a flexible printed circuit is provided. A plastic substrate is first provided. At least one signal wire is disposed on the plastic substrate. At least two ground lines are arranged at both sides of the signal wire in parallel. A flexible dielectric material covers the signal wire, and a shielding layer engages the plastic substrate to form a chamber that wraps the signal wire and ground lines therein.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
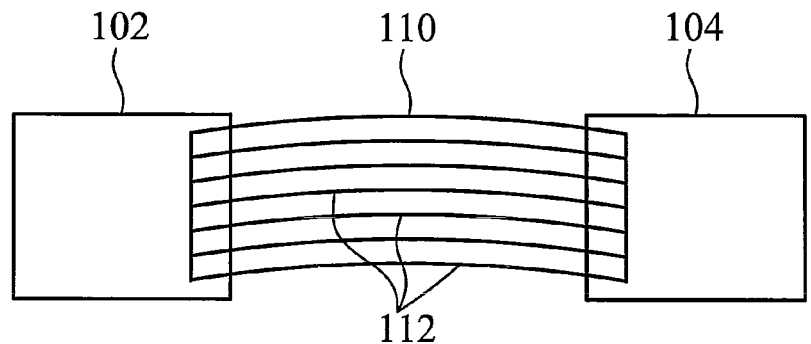
FIG. 1a shows a conventional Flexible Printed Circuit (FPC)
Figure 1B:
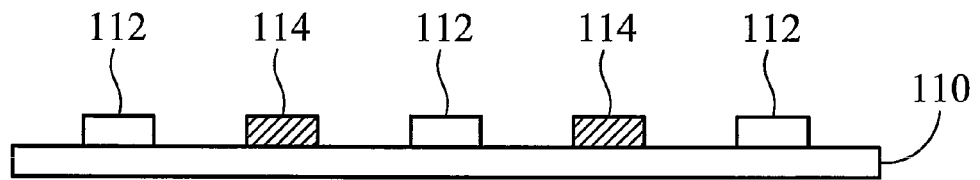
FIG. 1b is a cross-sectional view according to FIG. 1.

FIG. 1a shows a conventional Flexible Printed Circuit (FPC). A plurality of signal wires 112 are printed on a plastic substrate 110, connecting a first circuit board 102 to a second circuit board 104, such that signals can be transmitted between the first circuit board 102 and second circuit board 104. The signal wires 112 are actually shaped as long thin lines, as shown in FIG. 1b. Multiple signal wires 112 are arranged on the plastic substrate 110 in parallel, and a plurality of ground lines 114 are disposed aside the signal wires 112. However, as a transmission signal frequency increases, interference, such as coupling effects, occurs between the signal wires 112, thereby causing the quality of transmission to degrade. Therefore, the invention proposes an enhanced structure which adapts the metal shielding effect principle to mitigate coupling effects between the signal wires 112.

Figure 2:
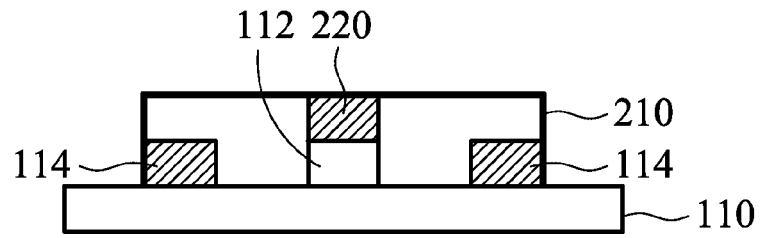
FIG. 2 shows a cross-sectional view of an FPC according to an embodiment of the invention.

FIG. 2 shows a cross-sectional view of an FPC according to an embodiment of the invention. A signal wire 112 is disposed on a plastic substrate. At both sides of the signal wire 112, two ground lines 114 are arranged in parallel. A flexible dielectric material 220 covers the signal wire 112, providing protection that insulates the signal wire 112 from external objects. The shielding layer 210 and the plastic substrate 110 together form a chamber which wraps the signal wire 112 and ground lines 114 therein. As shown in FIG. 2, the flexible dielectric material 220 insulates the signal wire 112 from the shielding layer 210, protecting the signal wire 112 from being shorted. The shielding layer 210 is typically a metal conductor made of a copper foil, a golden foil or an aluminum foil. The shielding layer 210 is preferably engaged with the ground lines 114 for a better grounding effect; however, such engagement is not required. In the embodiment shown the FIG. 2, the shielding layer 210 engages the plastic substrate 110 at the same portions where the shielding layer 210 engages the two ground lines 114.

The flexible dielectric material 220 may be made of polyethylene which is usually adapted for fabricating the FPC or coaxial cables. Through proper adjustment of the width and length of the signal wire 112, 50 ohms or 75 ohms impedance may be achieved.

Due to the shielding layer 210, high quality frequency modulation signals or radio frequency signals may be transmitted without coupling interference.

Figure 3:
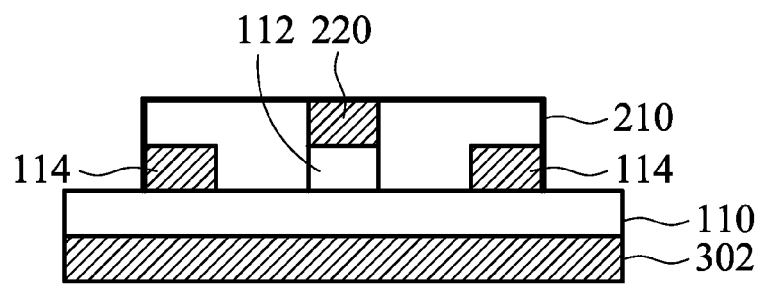
FIG. 3 shows a cross-sectional view of another embodiment of the FPC of the invention.

FIG. 3 shows a cross-sectional view of another embodiment of the FPC of the invention. Unlike the embodiment in FIG. 2, the FPC has a double layered structure. A ground layer 302 is arranged underneath the plastic substrate 110 to further increase the noise resistant ability. In the embodiment, only one signal wire 112 and two ground lines 114 are wrapped inside of the chamber formed by the plastic substrate 110 and the shielding layer 210, however, further variations can be made based on this structure. For example, multiple shielding layers 210 can be implemented on the plastic substrate 110, wherein each shielding layer 210 wraps a set of signal wires 112 and ground lines 114. Signal transmission efficiency is improved as no interference is induced between each shielding layer 210.

Figure 4:
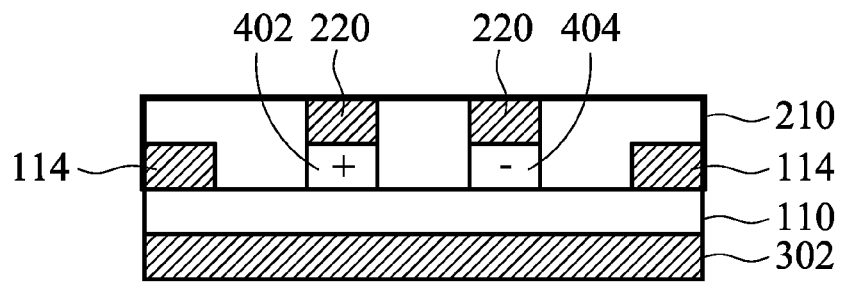
FIG. 4 shows a cross-sectional view of another embodiment of the FPC of the invention.

FIG. 4 shows a cross-sectional view of another embodiment of the FPC of the invention. In each shielding layer 210, the amount of signal wires 112 is not limited to only one. For example, every shielding layer 210 in FIG. 2 wraps two signal wires 402 and 404, which are arranged in parallel to transmit differential signals. The implementations in FIGS. 3 and 4 can be combined to render more variations. The plastic substrate 110 combined with the shielding layer 210 can be applied to a wide range of applications. For example, the FPC can be implemented in a single layered, a double layered, or a multiple layered FPC, or combinations thereof, and the material forming the FPC can be varied.

Figure 5:
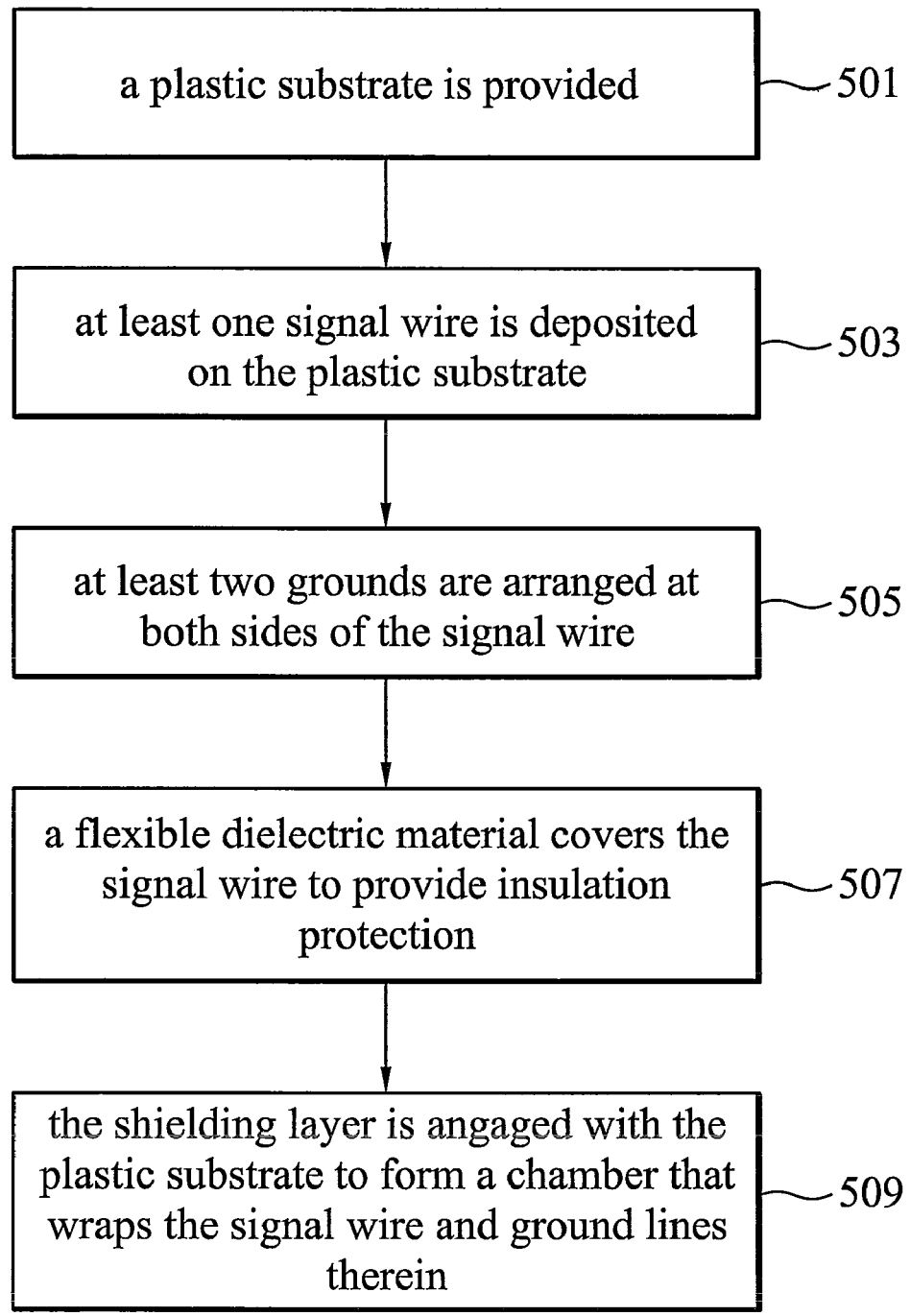
FIG. 5 is a flowchart of an FPC fabrication method according to the aforementioned embodiments.

FIG. 5 is a flowchart of an FPC fabrication method according to the aforementioned embodiments. The process is based on known technologies, but the arrangement of the shielding layer 210 is performed as a new feature. Specifically, in step 501, a plastic substrate is provided. In step 503, at least one signal wire is disposed on the plastic substrate. In step 505, at least two ground lines are disposed at both sides of the signal wire. In step 507, a flexible dielectric material 220 covers the signal wire to provide insulation protection. In step 509, a shielding layer 210 engages the plastic substrate to form a chamber that wraps the signal wire and ground lines therein.

In summary, the embodiment of the invention attaches copper foils on the signal wire to enhance grounding ability of the FPC. Specifically, by wrapping flexible dielectric materials over the signal wire, impedance of the FPC is better controlled without changing the basic structure of the FPC.

While the invention has been described by way of example and in terms of preferred embodiments, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flexible printed circuit, comprising:
   a plastic substrate;
   at least one signal wire disposed on the plastic substrate for transmitting signals;
   at least two ground lines arranged at both sides of the signal wire in parallel;
   a shielding layer, engaging the plastic substrate to form a closed chamber that wraps the signal wire and ground lines therein; and
   a flexible dielectric material disposed merely on the signal wire, and insulating the signal wire from the shielding layer.

2. The flexible printed circuit as claimed in claim 1, wherein the shielding layer is a conductive metal.

3. The flexible printed circuit as claimed in claim 2, wherein the shielding layer engages the plastic substrate at the same portions where the shielding layer engages the two ground lines.

4. The flexible printed circuit as claimed in claim 1, wherein the shielding layer is a copper foil.

5. The flexible printed circuit as claimed in claim 1, wherein the flexible dielectric material is polyethylene.

6. The flexible printed circuit as claimed in claim 1, further comprising a ground layer, arranged underneath the plastic substrate.

7. The flexible printed circuit as claimed in claim 1, wherein impedance of the signal wire is 50 ohms or 75 ohms.

8. The flexible printed circuit as claimed in claim 1, wherein the signal wire is adapted to transmit frequency modulated signals or radio frequency signals.

9. The flexible printed circuit as claimed in claim 1, wherein the at least one signal wire is two parallel signal wires adaptable to transmit differential signals.

10. A fabrication method for fabricating a flexible printed circuit, comprising:
    providing a plastic substrate;
    depositing at least one signal wire on the plastic substrate;
    arranging at least two ground lines at both sides of the signal wire in parallel;
    disposing a flexible dielectric material merely on the signal wire; and
    engaging a shielding layer with the plastic substrate to form a closed chamber that wraps the signal wire and ground lines therein; wherein the signal wire is insulated from the shielding layer by the flexible dielectric material.

11. The fabrication method as claimed in claim 10, wherein the shielding layer is a conductive metal.

12. The fabrication method as claimed in claim 11, wherein the step of laying the shielding layer comprises engaging the shielding layer with the two ground lines.

13. The fabrication method as claimed in claim 10, wherein the shielding layer is a copper foil.

14. The fabrication method as claimed in claim 10, wherein the flexible dielectric material is polyethylene.

15. The fabrication method as claimed in claim 10, further comprising arranging a ground layer underneath the plastic substrate.

16. The fabrication method as claimed in claim 10, wherein impedance of the signal wire is 50 ohm or 75 ohm.

17. The fabrication method as claimed in claim 10, wherein the signal wire is adapted to transmit frequency modulated signals or radio frequency signals.

18. The fabrication method as claimed in claim 10, wherein the at least one signal wire is two parallel signal wires adaptable to transmit differential signals.

* * * * *